United States Patent
Imai (10) Patent No.: US 9,040,973 B2
(45) Date of Patent: May 26, 2015

(54) ORGANIC IMAGE SENSOR AND METHOD OF PRODUCING THE SAME

(71) Applicant: FUJIFILM CORPORATION, Tokyo (JP)

(72) Inventor: Shinji Imai, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/058,172

(22) Filed: Oct. 18, 2013

(65) Prior Publication Data

US 2014/0042416 A1    Feb. 13, 2014

Related U.S. Application Data

(63) Continuation of application No. PCT/JP2012/002535, filed on Apr. 12, 2012.

(30) Foreign Application Priority Data

Apr. 20, 2011    (JP) .................................. 2011-093809

(51) Int. Cl.
*H01L 29/08*    (2006.01)
*H01L 21/00*    (2006.01)
*H01L 27/30*    (2006.01)
*H01L 51/44*    (2006.01)

(52) U.S. Cl.
CPC ............ *H01L 27/307* (2013.01); *H01L 51/441* (2013.01); *Y02E 10/549* (2013.01)

(58) Field of Classification Search
USPC ...................................... 257/40, 443; 438/73
See application file for complete search history.

(56) References Cited

U.S. PATENT DOCUMENTS

| | | | |
|---|---|---|---|
| 6,992,328 B2 | 1/2006 | Yamazaki et al. | |
| 7,920,189 B2 | 4/2011 | Goto | |
| 8,300,186 B2 * | 10/2012 | Imai et al. | 349/113 |
| 8,441,584 B2 * | 5/2013 | Ohyama et al. | 349/15 |
| 8,680,526 B2 * | 3/2014 | Nakayama et al. | 257/59 |
| 2011/0049492 A1 | 3/2011 | Sawaki et al. | |

FOREIGN PATENT DOCUMENTS

| | | |
|---|---|---|
| JP | 2002-198171 A | 7/2002 |
| JP | 2004-31262 A | 1/2004 |
| JP | 2008-177287 A | 7/2008 |

(Continued)

OTHER PUBLICATIONS

International Search Report for PCT/US2012/002535 mailed Jun. 19, 2012.

(Continued)

*Primary Examiner* — Fernando L Toledo
*Assistant Examiner* — Neil Prasad
(74) *Attorney, Agent, or Firm* — Studebaker & Brackett PC (57) ABSTRACT

Pixel electrodes have end portions inclined at inclination angles $\alpha$, where $30° \leq \alpha \leq 85°$, relative to a substrate surface of a substrate. An organic layer disposed on the pixel electrodes is formed by vapor deposition using deposition beams that enter the substrate surface at incident angles $\theta$ smaller than $90° - \alpha_{max}$, where $\alpha_{max}$ is the maximum inclination angle among the inclination angles of the end portions of the pixel electrodes, under a deposition substrate temperature condition lower than the glass transition temperature of the organic layer.

2 Claims, 4 Drawing Sheets

(56) References Cited

FOREIGN PATENT DOCUMENTS

| JP | 4213832 B2 | 11/2008 |
| JP | 2009-259978 A | 11/2009 |
| JP | 2011-35418 A | 2/2011 |
| JP | 2011-71469 A | 4/2011 |

OTHER PUBLICATIONS

Written Opinion for PCT/US2012/002535 mailed Jun. 19, 2012.

* cited by examiner

ORGANIC IMAGE SENSOR AND METHOD OF PRODUCING THE SAME

TECHNICAL FIELD

The present invention relates to an image sensor, and in particular to an image sensor including, at pixel portions thereof, an organic photoelectric conversion element having a photoelectric conversion layer formed by an organic layer.

BACKGROUND ART

Image sensors, such as CCD sensors and CMOS sensors, are widely known as image sensors used for digital still cameras, digital video cameras, mobile phone cameras, endoscope cameras, etc.

Currently, an image sensor having a layered structure, wherein a plurality of pixel electrodes are two-dimensional arranged on a substrate having a read-out circuit, etc., formed thereon, and an organic layer including at least a photoelectric conversion layer, and a counter electrode are formed in this order on the pixel electrodes, has been proposed (U.S. Pat. No. 7,920,189 (hereinafter, Patent Document 1)).

In the image sensor having a layered structure disclosed in Patent Document 1, the photoelectric conversion layer may be a continuous layer shared by all the pixel portions, or may be divided into parts corresponding to the individual pixel portions.

On the other hand, the image sensor provided with the continuous photoelectric conversion layer that is shared by the plurality of pixel electrodes has such problems that residual charges remain between the pixel electrodes and form a residual image of image information, and that the thickness of the photoelectric conversion layer is reduced at end portions of the pixel electrodes and electric field concentration occurs, resulting in leakage current, etc. In order to solve the above described problems, Japanese Unexamined Patent Publication Nos. 2008-177287 and 2009-259978 (hereinafter, Patent Documents 2 and 3, respectively), for example, propose providing the pixel electrodes having inclined end portions. Patent Document 2 teaches that it is preferable to incline the end portions of the pixel electrodes at an angle in the range from 30° to 120° relative to a planer substrate for suppressing occurrence of a residual image due to electric charges remaining between the pixel electrodes. Patent Document 3 teaches that it is preferable to incline the end portions at a predetermined inclination angle that is smaller than 90° for suppressing the decrease of the thickness of the photoelectric conversion layer at stepped portions of the end portions of the pixel electrodes and for suppressing occurrence of the electric field concentration.

DISCLOSURE OF INVENTION

With respect to an image sensor that includes an organic photoelectric conversion layer shared by the pixel portions, it is also conceivable to incline end portions of the pixel electrodes relative to the substrate surface to suppress a residual image or to suppress electric charge concentration, etc.

However, the present inventors have found, by making image sensors that include pixel electrodes having inclined end portions and an organic photoelectric conversion layer provided thereon by vapor deposition, that images obtained using such image sensors may have many point defects.

The present inventors have clarified, through simulations, problems unique to the image sensors provided with an organic photoelectric conversion layer.

Figure 9:
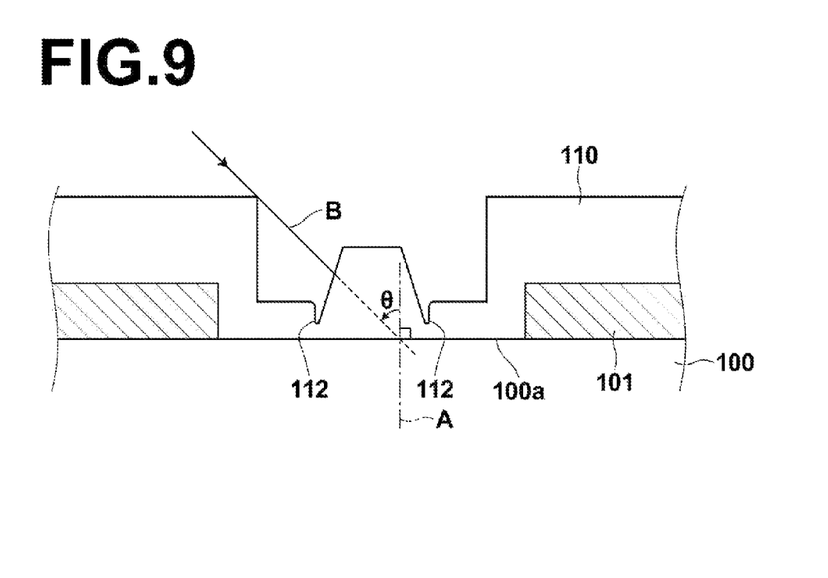
FIG. 9 is a sectional view illustrating a problem that occurs when an organic layer is deposited on pixel electrodes (case 1)

During the vapor deposition, a vapor deposition source (deposition cell) is disposed to face a surface to be subjected to vapor deposition of the substrate, and deposition beams enter the surface at various incident angles. FIG. 9 is a schematic diagram based on a simulation of a case where vapor deposition is performed using deposition beams with incident angles of 0° and 45° for conventional pixel electrodes having perpendicular end portions. It has been found through this simulation that, with respect to the deposition beams with the incident angle of 45°, as shown in FIG. 9, vignetting occurs due to end portions of pixel electrodes 101 and end portions of the deposited film itself, resulting in grooves 112 having a wedge-shaped cross section in the organic layer 110 at positions between the pixel electrodes 101. Then, actually, cracking in the organic layer originating from such grooves 112 was observed in the conventional image sensor including the pixel electrodes having perpendicular end portions and the organic layer provided thereon by vapor deposition.

The above-described problem of the wedge-shaped grooves occurs since it is necessary to form the organic layer at a temperature not higher than the glass transition temperature. This problem does not occur with the image sensor using amorphous selenium disclosed in Patent Document 2. Usually, amorphous selenium forms at a temperature higher than the glass transition temperature, and the surface of the formed film is smooth and almost flat. Therefore, even when vignetting of the deposition beams occurs, no wedge-shaped grooves remain in the surface of the organic layer.

On the other hand, one may expect that, in the case where the pixel electrodes having inclined end portions are provided, as in Patent Documents 2 and 3 as described above, the above-described wedge-shaped grooves will not be formed. Further, one may expect that, in the case where the deposition beams are inclined relative to the substrate surface at the same angle as the inclination angle of the end portions during vapor deposition, vignetting will not occur.

Figure 10:
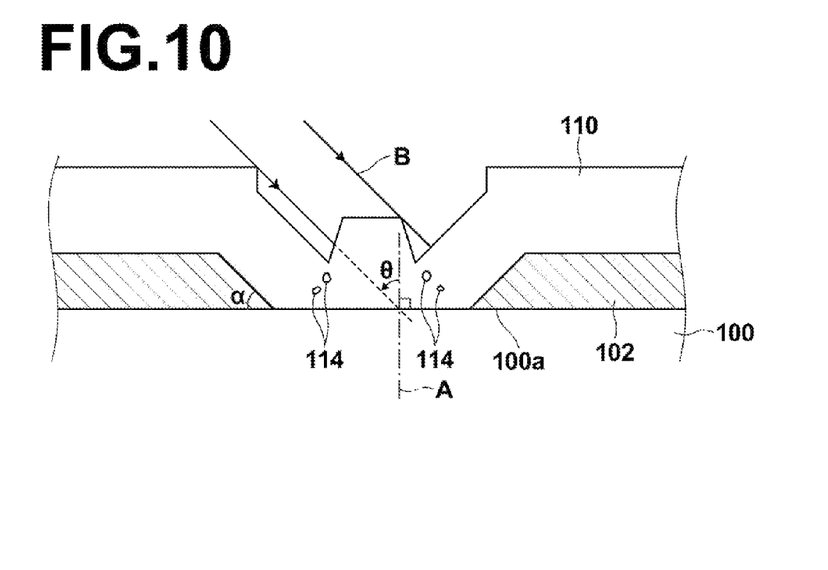
FIG. 10 is a sectional view illustrating a problem that occurs when an organic layer is deposited on pixel electrodes (case 2)

However, against these expectations, it has been found that vignetting occurs even when the deposition beams are inclined relative to the substrate surface at the same angle as the inclination angle of the end portions during vapor deposition. FIG. 10 is a schematic diagram based on a simulation of a case where the organic layer 110 is formed on pixel electrodes 102 having end portions inclined at an inclination angle of 45° by vapor deposition using deposition beams B with incident angles of 0° and 45°. As shown in FIG. 10, it has been found that, when the organic layer 110 is formed on the pixel electrodes 102 having an inclination angle $\alpha=45°$ relative to the substrate surface $100a$ using the deposition beams B with the incident angle $\theta=45°$, vignetting of part of the deposition beams B occurs along with the growth of the film. Due to this vignetting, small cavities 114 are formed in the organic layer 110 at boundaries between the end portions of the pixel electrode 102 and inter-pixel areas. The present inventors have found that these cavities 114 are main cause of the point defects.

In view of the above-described circumstances, the present invention is directed to providing an image sensor that does not introduce point defects in an image, and a method of producing the image sensor.

The image sensor of the invention is an image sensor having a plurality of pixel portions, the image sensor including:

a plurality of pixel electrodes arranged apart from one another on the substrate and corresponding in number to the number of the pixel portions;

an organic layer disposed in the form of a continuous film on and between the pixel electrodes, the organic layer including a photoelectric conversion layer shared by the plurality of pixel portions; and a counter electrode disposed on the organic layer and shared by the plurality of pixel portions, wherein the pixel electrodes have end portions inclined at inclination angles α, where 30°≤α≤85°, relative to a substrate surface of the substrate, and the organic layer is a film formed by vapor deposition using deposition beams that enter the substrate surface at incident angles smaller than 90°−$α_{max}$, where $α_{max}$ is a maximum inclination angle among the inclination angles of the end portions of the pixel electrodes, under a deposition substrate temperature condition lower than a glass transition temperature of the organic layer.

The organic layer of the image sensor of the invention is formed along the pixel electrodes and depressions between the electrodes, and the surface shape of the organic layer almost conforms to the uneven shape formed by the surfaces of the pixel electrodes and the depressions between the electrodes. Also, the surface shape of the counter electrode disposed on the organic layer almost conforms to the uneven shape of the organic layer. The surfaces of the depressions corresponding to the areas between the pixel electrodes are smooth and have no wedge-shaped grooves. Further, almost no cavities are present around the boundaries of the depressions in the organic layer. Therefore, an image obtained by the image sensor is almost free of point defects due to cavities around the boundaries of the depressions.

The method of producing the image sensor of the invention is a method of producing an organic image sensor having a plurality of pixel portions, the organic image sensor including a plurality of pixel electrodes arranged apart from one another on the substrate, an organic layer disposed in the form of a continuous film on and between the pixel electrodes, the organic layer including a photoelectric conversion layer shared by the plurality of pixel portions, and a counter electrode disposed on the organic layer and shared by the plurality of pixel portions, the method including the steps of:

forming, as the electrodes on the substrate, a plurality of pixel electrodes having end portions inclined at inclination angles α, where 30°≤α≤85°, relative to a substrate surface of the substrate; and forming an organic layer including a photoelectric conversion layer that generates electric charges depending on received light above the pixel electrodes by vapor deposition using deposition beams that enter the substrate surface at incident angles smaller than 90°−$α_{max}$, where $α_{max}$ is a maximum inclination angle among the inclination angles of the end portions of the pixel electrodes, under a deposition substrate temperature condition lower than a glass transition temperature of the organic layer.

The incident angle of the deposition beam herein refers to an angle of inclination relative to an axis perpendicular to the substrate surface on which the electrodes are formed.

In the image sensor of the invention, the pixel electrodes have end portions inclined at inclination angles α (where 30°≤α≤85°) relative to the substrate surface of the substrate, and the organic layer disposed on the pixel electrodes is a film formed by vapor deposition using deposition beams that enter the substrate surface at incident angles smaller than 90°−$α_{max}$ under a deposition substrate temperature condition lower than the glass transition temperature of the organic layer. Therefore, areas of the organic layer corresponding to the end portions of the pixel electrodes are almost free of small wedge-shaped grooves or small cavities. This allows suppressing cracking in the organic layer of the image sensor of the invention, and an image almost free of point defects can be obtained.

According to the method of producing the image sensor of the invention, the step of forming, above a plurality of pixel electrodes having end portions inclined at inclination angles α (where 30°≤α≤85°) on the substrate surface of the substrate, an organic layer including a photoelectric conversion layer that generates electric charges depending on received light by vapor deposition using deposition beams that enter the substrate surface at incident angles smaller than 90°−$α_{max}$, at a deposition substrate temperature lower than a glass transition temperature of the organic layer is included. Therefore, the areas of the photoelectric conversion layer corresponding to areas between the pixel electrodes are free of small cavities, thereby providing an image sensor that does not introduce point defects.

Further, the depressions of the photoelectric conversion layer are free of wedge-shaped grooves or protrusions. This allows suppressing cracking, and in turn suppressing leakage current, etc.

DESCRIPTION OF PREFERRED EMBODIMENTS

Hereinafter, embodiments of the present invention will be described with reference to the drawings.

Image Sensor

Figure 1:
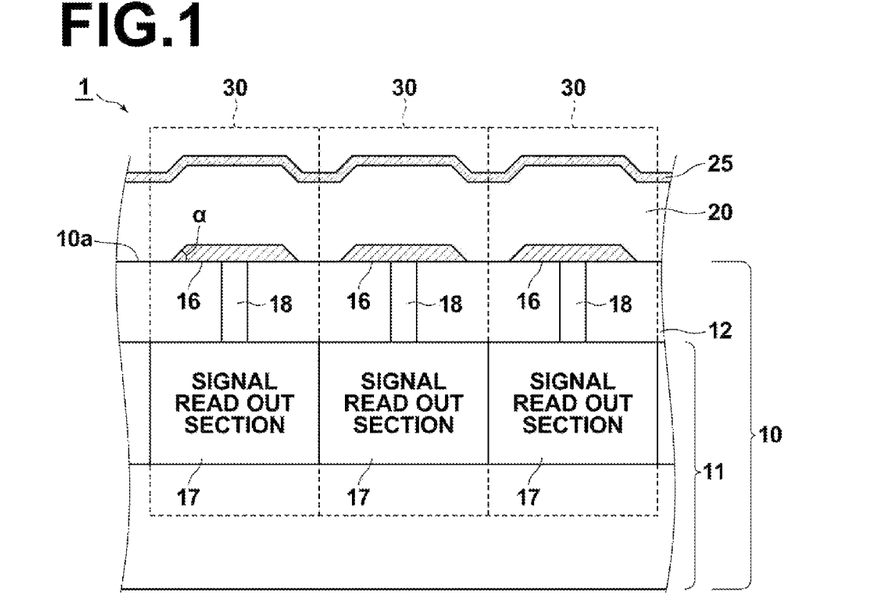
FIG. 1 is a schematic sectional view illustrating a part of an image sensor according to an embodiment of the invention.

FIG. 1 is a schematic sectional view illustrating the structure of an image sensor 1 according to an embodiment of the invention.

As shown in FIG. 1, the image sensor 1 of this embodiment includes: a substrate 10; a plurality of pixel electrodes 16 arranged apart from one another on the substrate 10; an organic layer 20 disposed in the form of a continuous film on and between the pixel electrodes 16; and a counter electrode 25 disposed on the organic layer 20.

Each pixel electrode 16 has end portions (tapered portions) that are inclined at an inclination angle α (where 30°≤α≤85°) relative to a substrate surface 10a of the substrate 10. The inclination angles of the end portions of the pixel electrodes 16 are almost uniform with slight variations. It should be noted that the maximum inclination angle among the inclination angles α of the end portions of all the pixel electrodes 16 is a maximum inclination angle $α_{max}$.

The organic layer 20 includes at least a photoelectric conversion layer made of an organic photoelectric conversion material that generates electric charges depending on received light, and the organic layer 20 has a single layer or multilayer structure. Besides the photoelectric conversion layer, the organic layer 20 can include an electric charge blocking layer, such as an electron blocking layer. It should be noted that a layer made of an inorganic material may be included between the plurality of organic layers.

The organic layer 20 is a film formed by vapor deposition using deposition beams that enter the substrate surface 10a at an incident angle θ smaller than $90°-α_{max}$, under a deposition substrate temperature condition lower than the glass transition temperature.

The substrate 10 includes: a circuit board 11 that is made of glass or a semiconductor, such as silicon, and is provided on the surface thereof with a circuit including a signal read out section 17; and an insulating layer 12 provided on the surface of the circuit board 11.

The pixel electrodes 16 are two-dimensionally arranged at regular intervals on the surface of the insulating layer 12 (the substrate surface 10a). Connecting sections 18 for electrically connecting the individual pixel electrodes 16 to the corresponding read out sections 17 are embedded in the insulating layer 12. The connecting sections 18 are columnar members (via plugs, for example) made of an electrically conductive material, such as tungsten (W).

The pixel electrodes 16 are charge collection electrodes for collecting electric charges generated in the photoelectric conversion layer in the organic layer 20.

The counter electrode 25 is an electrode facing the pixel electrodes 16 and is disposed on the organic layer 20.

The counter electrode 25 applies an electric field to the organic layer 20 by sandwiching the organic layer 20 including the photoelectric conversion layer between the counter electrode 25 and the pixel electrodes 16, and collects, among electric charges generated in the photoelectric conversion layer, electric charges having an opposite polarity from that of signal electric charges collected by the pixel electrodes 16. The collection of the electric charges having the opposite polarity need not be performed for each pixel. Therefore, the counter electrode 25 can be shared by the plurality of pixels and may be referred to as "common electrode" for this reason.

It is preferred that the counter electrode 25 is made of a transparent conductive film in order to let light enter the organic layer 20 including the photoelectric conversion layer. Examples of material forming the transparent conductive film include a metal, a metal oxide, a metal nitride, a metal boride, an organic conductive compound, a mixture thereof, etc. Specific examples thereof include: a conductive metal oxide, such as tin oxide, zinc oxide, indium oxide, indium tin oxide (ITO), indium zinc oxide (IZO), indium tungsten oxide (IWO), titanium oxide, etc.; a metal nitride, such as TiN; a metal, such as gold (Au), platinum (Pt), silver (Ag), chromium (Cr), nickel (Ni), aluminum (Al), etc., and a mixture or a laminate of any of these metals and a conductive metal oxide; an organic conductive compound, such as polyaniline, polythiophene, polypyrrole, etc., and a laminate of any of these compounds and ITO; etc. A particularly preferred material as the material forming the transparent conductive film is any of ITO, IZO, tin oxide, antimony-doped tin oxide (ATO), fluorine-doped tin oxide (FTO), zinc oxide, antimony-doped zinc oxide (AZO), and gallium-doped zinc oxide (GZO).

In a case where the signal read out section 17 is of a CMOS type, the surface resistance of the counter electrode 25 is preferably 10 kΩ/□ or less, and more preferably 1 kΩ/□ or less. In a case where the signal read out section 17 is of a CCD type, the surface resistance of the counter electrode 25 is preferably 1 kΩ/□ or less, and more preferably 0.1 kΩ/□ or less.

In this image sensor 1, one pixel electrode 16, the counter electrode 25 above the pixel electrode 16 and the organic layer 20 disposed between these electrodes form one photoelectric conversion device.

The signal read out section 17 is provided correspondingly to each pixel electrodes 16. Each signal read out section 17 outputs a signal depending on the electric charge collected by the corresponding pixel electrode 16. The signal read out section 17 is formed, for example, by a CCD, a MOS transistor circuit (MOS circuit), a TFT circuit, or the like.

In a case where the signal read out section 17 is formed by a MOS circuit, for example, the MOS circuit includes a floating diffusion, a reset transistor, an output transistor and a select transistor (which are not shown in the drawing). Each of the reset transistor, the output transistor and the select transistor is formed by an n-channel MOS transistor (which will hereinafter be referred to as "n-MOS transistor")

With such a circuit structure, each signal read out section 17 reads out a signal depending on the electric charge collected by the corresponding pixel electrode 16.

In the image sensor 1, one pixel portion 30 (each area enclosed by the dashed lines in FIG. 1) is formed by one photoelectric conversion device and the corresponding signal read out section 17. That is, the image sensor 1 includes a plurality of pixel portions 30 arranged in an array.

It should be noted that the electric charge collected by each pixel electrode 16 becomes a signal read out by the signal read out section 17 of the corresponding pixel portion 30, and an image is composed based on signals obtained from the plurality of pixel portions.

Next, details of the pixel electrodes and the organic layer are described.

Figure 2:
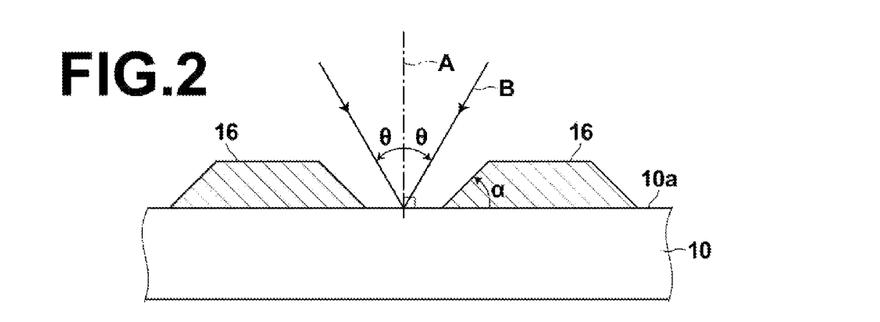
FIG. 2 is a schematic sectional view illustrating an inclination angle of end portions of pixel electrodes of the image sensor and an incident angle of deposition beam B for forming an organic layer.
Figure 3:
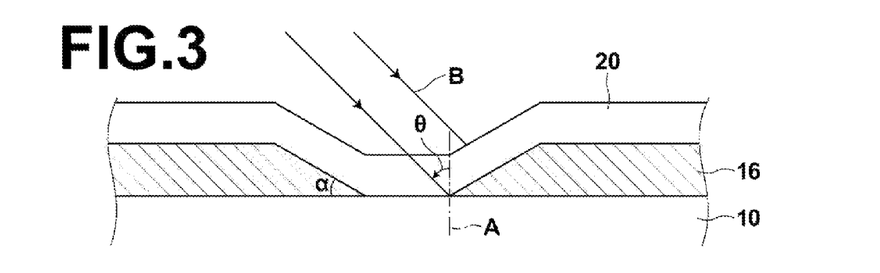
FIG. 3 is a schematic sectional view illustrating a part of a production process of the image sensor shown in FIG. 1.

FIGS. 2 and 3 are schematic sectional views showing an inclination angle α of the pixel electrodes 16 and an incident angle of the deposition beams for forming the organic layer 20.

Pixel Electrodes

The pixel electrodes 16 are formed by forming a film on the insulating layer 12 (substrate surface 10a) by sputtering, or the like, and then etching the formed film into a predetermined pattern using a mask. Before the organic layer 20 is formed, the substrate surface 10a is exposed between the pixel electrodes 16 (see FIG. 2).

The material forming the pixel electrodes may be any of electrically conductive materials commonly used to form electrodes. Among them, tungsten (W), TiN, or the like, can be preferably used.

In view of obtaining a remarkable level of the effect of the invention, the size of each pixel electrode 16 is preferably not more than 3 μm, more preferably not more than 2 μm, and even more preferably not more than 1.5 μm. Also, in view of obtaining a remarkable level of the effect of the invention, the gap between the pixel electrodes 16 is preferably not more than 0.3 μm, more preferably not more than 0.25 μm, and even more preferably not more than 0.2 μm.

As shown in FIGS. 2 and 3, the inclination angle α of the end portions of the pixel electrodes is an angle formed between the substrate surface 10a and each end portion of the pixel electrodes. The inclination angle α of the pixel electrodes is not less than 30° and not more than 85°. It is desirable that the pixel electrodes formed in one image sensor have almost uniform inclination angles; however, there may be variation in the range of not less than 30° and not more than 85°. It is more preferable that the inclination angle is not less than 45° and not more than 75°.

The smaller the inclination angle α, the lower the occurrence of defects in the organic layer provided on the pixel electrodes. However, if the inclination angle α is less than 30°, a residual image may be formed, and this is not preferable. When the inclination angle α is in the range of not less than 30° and not more than 85°, an electric field formed when the inclined end portions are charged acts on areas on the gaps between the pixel electrodes, and leakage charges passed through the areas on the gaps between the pixel electrodes are tend to be drawn to the inclined surfaces of the electrodes, thereby reducing formation of a residual image due to the leakage charges.

Further, when the inclination angle α is not less than 45°, electric field concentration at tips of the inclined end portions is suppressed, and this allows applying a higher voltage to increase the sensitivity. Further, when the inclination angle α is not more than 75°, deposition beams with a wider range of incident angles can be applied, and this significantly improves the use efficiency of the organic material.

Organic Layer

The organic layer 20 is formed to cover the pixel electrodes 16 and the substrate surface 10a exposed between the pixel electrodes 16. The organic layer 20 is formed by vapor deposition, and the surface of the organic layer 20 reflects the shapes of the pixel electrodes, the end portions of the electrodes and the areas between the pixel electrodes.

As shown in FIG. 2, the incident angle θ of the deposition beam B for forming the organic layer 20 is an inclination angle of the deposition beam relative to an axis A perpendicular to the substrate surface 10a. The organic layer 20 is formed by the deposition beams with the incident angles θ relative to the substrate 10 on which the pixel electrodes are formed, where the relationship between the incident angles θ and the maximum inclination angle $\alpha_{max}$ among the inclination angles α of the pixel electrodes satisfies $\theta<(90°-\alpha_{max})$. As shown in FIG. 2, the range of the incident angles that satisfies the relationship $\theta<(90°-\alpha_{max})$ is shown as a conical range. During the vapor deposition, deposition beams with one incident angle may be used, or deposition beams with various incident angles that satisfy the relationship $\theta<(90°-\alpha_{max})$ may be used.

The deposition beams with such incident angles θ are applied onto the pixel electrodes and the substrate surface exposed between the pixel electrodes without vignetting due to the organic layer 20 being formed. Thus, the organic layer 20 conforming to the shape of the pixel electrodes 16 can be deposited without forming the wedge-shaped grooves 112 or the cavities 114, as shown in FIG. 9 or 10, in the organic layer 20.

As described previously, the organic layer 20 includes at least the photoelectric conversion layer, and may also include other layers, such as an electric charge blocking layer.

The electric charge blocking layer has a function of suppressing dark current. The electric charge blocking layer may be formed by a plurality of layers, such as a first blocking layer and a second blocking layer. When the electric charge blocking layer is formed by the plurality of layers, an interface is formed between the first blocking layer and the second blocking layer, and discontinuity is formed between the intermediate levels present in the individual layers. This hinders charge carriers from moving through the intermediate levels, thereby suppressing the dark current. It should be noted that the electric charge blocking layer may be formed by a single layer.

The photoelectric conversion layer includes a p-type organic semiconductor and an n-type organic semiconductor. By forming a donor-acceptor interface by placing the p-type organic semiconductor and the n-type organic semiconductor in contact, exciton dissociation efficiency can be increased. For this reason, a photoelectric conversion layer formed by placing the p-type organic semiconductor and the n-type organic semiconductor in contact expresses high photoelectric conversion efficiency. In particular, a photoelectric conversion layer formed by mixing the p-type organic semiconductor and the n-type organic semiconductor preferably provides an increased junction interface and increased photoelectric conversion efficiency.

The p-type organic semiconductor (compound) is a donor organic semiconductor. A typical example thereof is a hole transporting organic compound, which is an organic compound that tends to donate electrons. More particularly, when two organic materials are used in contact with each other, the hole transporting organic compound is the organic compound having lower ionization potential. Therefore, any electron-donating organic compound can be used as the donor organic compound. For example, a triaryl amine compound, a benzidine compound, a pyrazoline compound, a styryl amine compound, a hydrazone compound, a triphenyl methane compound, a carbazole compound, a polysilane compound, a thiophene compound, a phthalocyanine compound, a cyanine compound, a merocyanine compound, an oxonol compound, a polyamine compound, an indole compound, a pyrrol compound, a pyrazole compound, a polyarylene compound, a condensed aromatic carbocyclic compound (a naphthalene derivative, an anthracene derivative, a phenanthrene derivative, a tetracene derivative, a pyrene derivative, a perylene derivative, a fluoranthene derivative), a metal complex having a nitrogen-containing heterocyclic compound as a ligand, etc., may be used. Besides the above-listed examples, any organic compound that has lower ionization potential than that of an organic compound used as the n-type (acceptor) compound may be used as the donor organic semiconductor, as mentioned above.

The n-type organic semiconductor (compound) is an acceptor organic semiconductor. A typical example thereof is an electron transporting organic compound, which is an organic compound that tends to accept electrons. More particularly, when two organic materials are used in contact with each other, the n-type organic semiconductor is the organic compound having higher electron affinity. Therefore, any electron-accepting organic compound can be used as the acceptor organic compound. For example, a condensed aromatic carbocyclic compound (a naphthalene derivative, an anthracene derivative, a phenanthrene derivative, a tetracene derivative, a pyrene derivative, a perylene derivative, a fluoranthene derivative), a nitrogen atom, an oxygen atom, a sulfur atom-containing 5- to 7-membered heterocyclic compound (such as pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrrolidine, pyrrolopyridine, thiadiazolopyridine, dibenzazepine, tribenzazepine, etc.), a polyarylene compound, a fluorene compound, a cyclopentadiene compound, a silyl compound, a metal complex having a nitrogen-containing heterocyclic compound as a ligand, etc., may be used. Besides the above-listed examples, any organic compound having higher electron affinity than that of an organic compound used as the p-type (donor) compound may be used as the acceptor organic semiconductor, as mentioned above.

Any organic dye may be used as the p-type organic semiconductor or the n-type organic semiconductor. Preferred examples thereof include a cyanine dye, a styryl dye, a hemicyanine dye, a merocyanine dye (including zeromethine merocyanine (simple merocyanine)), a trinuclear merocyanine dye, a tetranuclear merocyanine dye, a rhodacyanine dye, a complex cyanine dye, a complex merocyanine dye, an allopolar dye, an oxonol dye, a hemioxonol dye, a squarylium dye, a croconium dye, an azamethine dye, a coumarin dye, an arylidene dye, an anthraquinone dye, a triphenyl methane dye, an azo dye, an azomethine dye, a spiro compound, a metallocene dye, a fluorenone dye, a fulgide dye, a perylene dye, a perynone dye, a phenazine dye, a phenothiazine dye, a quinone dye, a diphenyl methane dye, a polyene dye, a acridine dye, an acridinone dye, a diphenyl amine dye, a quinacridone dye, a quinophthalone dye, a phenoxazine dye, a phthaloperylene dye, a diketopyrrolopyrrol dye, a dioxane dye, a porphyrin dye, a chlorophyll dye, a phthalocyanine dye, a metal complex dye, and a condensed aromatic carbon ring-based dye (a naphthalene derivative, an anthracene derivative, a phenanthrene derivative, a tetracene derivative, a pyrene derivative, a perylene derivative, a fluoranthene derivative).

It is particularly preferable to use, as the n-type organic semiconductor, a fullerene or a fullerene derivative, which has an excellent electron transporting property. The fullerene refers to fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, mixed fullerene and fullerene nanotube, and the fullerene derivative refers to a compound of any of these fullerenes with a substituent.

Preferred examples of the substituent of the fullerene derivative include an alkyl group, an aryl group and a heterocyclic group. Preferred examples of the alkyl group include alkyl groups having a carbon number of 1 to 12. Preferred examples of the aryl group and the heterocyclic group include benzene ring, naphthalene ring, anthracene ring, phenanthrene ring, fluorene ring, triphenylene ring, naphthacene ring, biphenyl ring, pyrrol ring, furan ring, thiophene ring, imidazole ring, oxazole ring, thiazole ring, pyridine ring, pyrazine ring, pyrimidine ring, pyridazine ring, indolizine ring, indole ring, benzofuran ring, benzothiophene ring, isobenzofuran ring, benzimidazole ring, imidazopyridine ring, quinolizine ring, quinoline ring, phthalazine ring, naphthyridine ring, quinoxaline ring, quinoxazoline ring, isoquinoline ring, carbazole ring, phenanthridine ring, acridine ring, phenanthroline ring, thianthrene ring, chromene ring, xanthene ring, phenoxathiin ring, phenothiazine ring and phenazine ring. Among them, benzene ring, naphthalene ring, anthracene ring, phenanthrene ring, pyridine ring, imidazole ring, oxazole ring or thiazole ring is more preferable, and benzene ring, naphthalene ring or pyridine ring is particularly preferable. Such a ring may have a substituent, and the substituent may form a possible bond and may form a ring. The fullerene derivative may have a plurality of substituents, which may be the same or different from one another. The plurality of substituents may form a possible bond and may form a ring.

In the case where the photoelectric conversion layer contains a fullerene or fullerene derivative, the electrons generated by photoelectric conversion can be quickly transported to the pixel electrodes 16 or the counter electrodes 25 via the fullerene molecules or fullerene derivative molecules. When electron paths are formed by strings of fullerene molecules or fullerene derivative molecules, electron transporting capability is improved and high speed response of the photoelectric conversion device can be achieved. To this end, it is preferable that the content of the fullerene or fullerene derivative in the photoelectric conversion layer is 40% or more. However, if the fullerene or fullerene derivative content is excessively high, the amount of the p-type organic semiconductor is reduced accordingly, resulting in reduction of the area of the junction interface and thus low exciton dissociation efficiency.

In view of making the photoelectric conversion device express high SN ratio, it is particularly preferable to use a triaryl amine compound taught in Japanese Patent No. 4213832, etc., as the p-type organic semiconductor to be mixed with the fullerene or fullerene derivative in the photoelectric conversion layer. If the ratio of the fullerene or fullerene derivative in the photoelectric conversion layer is excessively high, the amount of the triaryl amine compound is reduced accordingly, resulting in low absorption of the incident light and thus low photoelectric conversion efficiency. It is therefore preferable that the content of the fullerene or fullerene derivative in the photoelectric conversion layer is 85% or less.

An electron-donating organic material may be used to form the first blocking layer and the second blocking layer. Specific examples of a low-molecular electron-donating organic material include an aromatic diamine compound, such as N,N'-bis(3-methylphenyl)-(1,1'-biphenyl)-4,4'-diamine (TPD) or 4,4'-bis[N-(naphthyl)-N-phenyl-amino]biphenyl (α-NPD), oxazole, oxadiazole, triazole, imidazole, imidazolone, a stilbene derivative, a pyrazoline derivative, tetrahydro imidazole, polyaryl alkane, butadiene, 4,4',4"-tris (N-(3-methylphenyl)N-phenylamino)triphenylamine (m-MTDATA) porphine, a porphyrin compound, such as copper tetraphenylporphine, phthalocyanine, copper phthalocyanine or titanium phthalocyanine oxide, a triazole derivative, an oxadizazole derivative, an imidazole derivative, a polyaryl alkane derivative, a pyrazoline derivative, a pyrazolone derivative, a phenylenediamine derivative, an arylamine derivative, an amino-substituted chalcone derivative, an oxazole derivative, a styryl anthracene derivative, a fluorenone derivative, a hydrazone derivative, a silazane derivative, etc. Specific examples of a high-molecular electron-donating organic material include a polymer, such as phenylene vinylene, fluorene, carbazole, indole, pyrene, pyrrol, picoline, thiophene, acetylene, diacetylene, etc., and a derivative thereof. The material forming the first and second blocking layers may not be an electron-donating compound, and any compound having sufficient hole transporting capability can be used.

An inorganic material may be used to form the electric charge blocking layer(s). In general, an inorganic material has a higher permittivity than an organic material. Therefore, when an inorganic material is used to form the electric charge blocking layer, more voltage is applied to the photoelectric conversion layer, and this can increase the photoelectric conversion efficiency. Examples of the material that may be used to form the electric charge blocking layer include calcium oxide, chromium oxide, copper chromium oxide, manganese oxide, cobalt oxide, nickel oxide, copper oxide, copper gallium oxide, copper strontium oxide, niobium oxide, molybdenum oxide, copper indium oxide, silver indium oxide, iridium oxide, etc.

In the case where the electric charge blocking layer is formed by a plurality of layers, it is preferable that the layer adjacent to the photoelectric conversion layer among the layers forming the electric charge blocking layer is made of the same material as the p-type organic semiconductor material contained in the photoelectric conversion layer. By using the same p-type organic semiconductor to form the electric charge blocking layer in this manner, formation of the intermediate level at the interface between the photoelectric conversion layer and the layer adjacent to the photoelectric conversion layer can be suppressed, allowing further suppression of the dark current.

In the case where the electric charge blocking layer is formed by a single layer, the layer may be made of an inorganic material. In the case where the electric charge blocking layer is formed by a plurality of layers, one or two or more layers among the layers may be made of an inorganic material.

Method of Producing Image Sensor

Next, a method of producing a photoelectric conversion device is described.

First, using a common semiconductor fabrication process, the circuit board 11 is produced by forming the signal read out sections 17 on a substrate, such as silicon. Thereafter, the insulating layer 12 is formed on the light entering-side surface of the circuit board 11, and the surface of the insulating layer 12 is flattened by polishing, such as CMP. Then, holes for forming the connecting sections 18 are formed in the insulating layer 12 by a photolithography step or a dry etching step. The holes are formed at positions of the insulating layer 12 below the areas where the pixel electrodes 16 are formed. In the thus formed holes, the connecting sections 18 are formed using an electrically conductive material.

In this embodiment, the structure including the insulating layer 12 and the connecting sections 18 embedded in the insulating layer 12 on the semiconductor circuit board 11 is referred to as the substrate 10, and the surface of the insulating layer 12 is referred to as the substrate surface 10a.

Pixel Electrode Forming Step

The material for forming the pixel electrodes 16 is deposited on the insulating layer 12 by a physical vapor deposition (PVD) method and the deposited film is patterned to form the pixel electrodes 16. As the physical vapor deposition method, sputtering may be used, for example. The patterning is achieved by etching the deposited film using a mask so that the pixel electrodes 16 are arranged at regular intervals on the surface of the insulating layer 12. At this time, the etching is performed to provide a desired inclination angle $\alpha$ ($30°\leq\alpha\leq85°$) at the end portions of the pixel electrodes 16. For example, dry etching using inductively-coupled plasma (ICP) may be performed to form tapered portions with the desired inclination angle $\alpha$ at the end portions of the pixel electrodes. For details of the method for forming the tapered portions, see Japanese Unexamined Patent Publication No. 2011-035418, for example.

In this manner, as shown in FIG. 2, the plurality of pixel electrodes 16 are formed on the substrate surface 10a of the substrate 10. At this time, the pixel electrodes 16 are two-dimensionally arranged apart from one another, and the substrate surface 10a is exposed between the pixel electrodes 16.

Organic Layer Deposition Step

Subsequently, the organic layer 20 is deposited to cover the pixel electrodes 16 and the substrate surface 10a exposed between the pixel electrodes 16. The deposition of the organic layer 20 is achieved by using a vacuum vapor deposition method. More specifically, a resistance heating vapor deposition method or an electron beam heating vapor deposition method is used.

The deposition of the organic layer 20 is performed in a state where the deposition substrate temperature is lower than the glass transition temperature of the organic layer 20. It should be noted that the glass transition temperature can be measured, for example, using DSC (differential scanning calorimetry).

The organic layer 20 is deposited on the pixel electrodes 16 and the substrate surface 10a exposed between the pixel electrode by applying deposition beams to the substrate 10 having the pixel electrodes formed thereon such that the relationship between the incident angles $\theta$ and the maximum inclination angle $\alpha_{max}$ of the inclination angles $\alpha$ of the pixel electrodes satisfies $\theta<(90°-\alpha_{max})$. This allows depositing the organic layer 20 conforming to the shape of the pixel electrodes 16 without forming the wedge-shaped grooves 112 or the cavities 114, as shown in FIG. 9 or 10.

It should be noted that, if the incident angles of the deposition beams B can be controlled for each pixel electrode, the incident angles $\theta$ of the deposition beams B smaller than $90°-\alpha$ relative to the inclination angle $\alpha$ of the end portions of each pixel electrode are sufficient. However, since it is difficult to control the incident angles of the deposition beams B for each pixel electrode, the incident angles $\theta$ are defined relative to the maximum inclination angle $\alpha_{max}$.

Further, while the incident angles $\theta$ of the deposition beams that satisfies $\theta<90°-\alpha_{max}$ are sufficient, the incident angles $\theta$ may preferably satisfy $\theta<90°-(\alpha_{max}+2°)$, or more preferably $\theta<90°-(\alpha_{max}+5°)$ with taking error in the vapor deposition apparatus, etc., into account.

Figure 4:
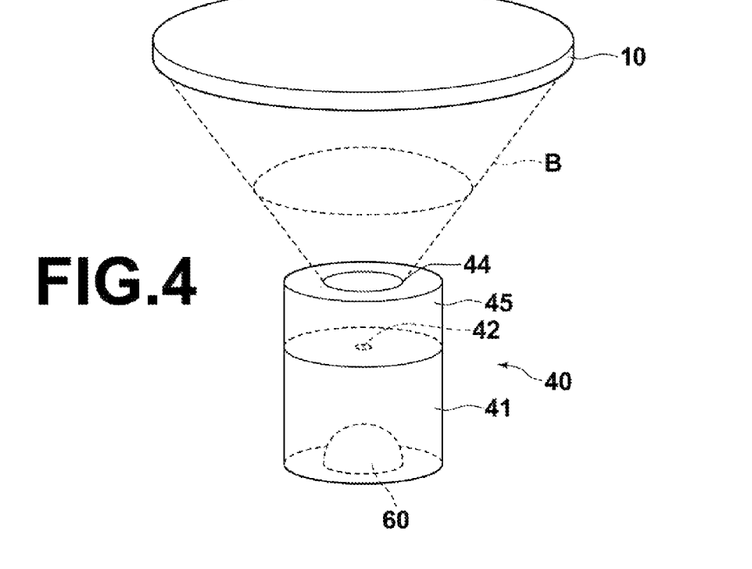
FIG. 4 is a schematic perspective view illustrating a vapor deposition method for depositing the organic layer.

FIG. 4 is a perspective view schematically illustrating a vapor deposition method for depositing the organic layer on the substrate. As shown in FIG. 4, the deposition of the organic layer is performed in a state where the substrate 10 is placed above the opening of a deposition cell 40.

The deposition cell 40 includes a first opening 42, a cylindrical housing 41 storing a deposition material 60 therein, and a cylindrical portion 45 that is formed continuously with the housing 41 to surround the first opening 42 and includes a second opening 44.

The interior of a deposition chamber is highly vacuum, and therefore the deposition material exiting through the opening 44 travels straight. Therefore, the exiting angles of the deposition beams B can be controlled by controlling opening diameters of the first opening 42 and the second opening 44.

As shown in FIG. 4, the deposition material spreads substantially conically from the opening 44 of the deposition cell 40 toward the substrate 10.

Figure 5:
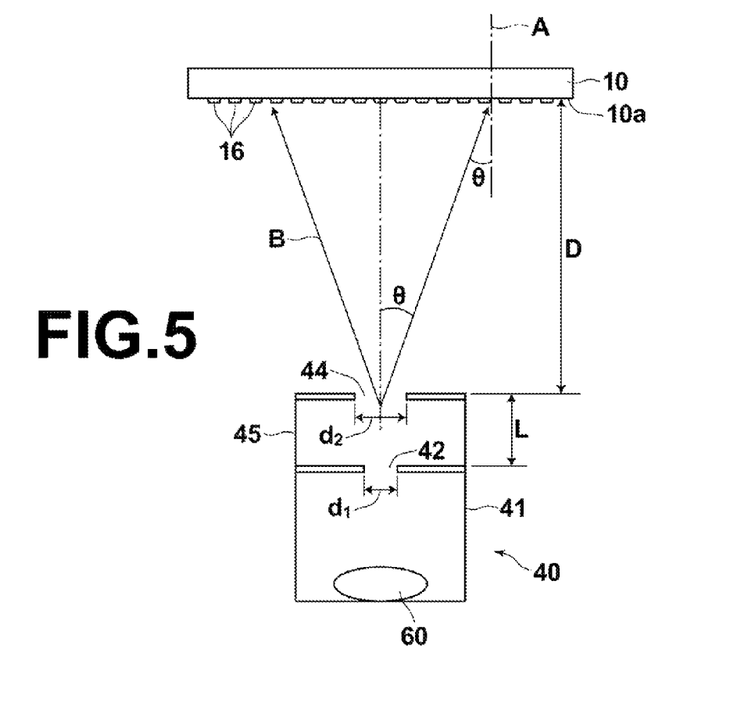
FIG. 5 is a schematic sectional view illustrating the vapor deposition method for depositing the organic layer.

FIG. 5 is a sectional view schematically illustrating the positional relationship between the substrate 10 and the deposition cell 40.

As shown in FIG. 5, a spread angle $\theta$ of the deposition beams B can be defined by an opening diameter $d_1$ of the first opening 42, an opening diameter $d_2$ of the second opening 44 and a distance L between the opening 42 and the opening 44. This spread angle $\theta$ is an inclination relative to the axis A perpendicular to the substrate surface 10a, i.e., the maximum incident angle $\theta$ of the deposition beams B relative to the substrate surface 10a.

The deposition beams exiting from the deposition cell 40 enter the substrate surface 10a at incident angles in the range from 0° to $\theta$.

Figure 6:
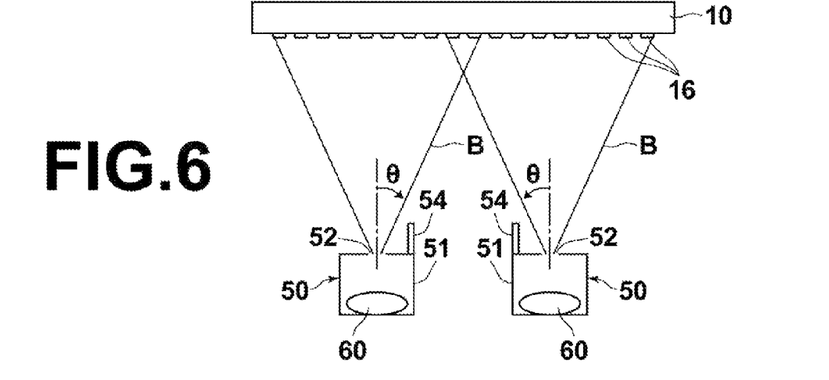
FIG. 6 is a schematic sectional view illustrating another vapor deposition method for depositing the organic layer.

FIG. 6 is a sectional view schematically illustrating another vapor deposition method for depositing the organic layer. As shown in FIG. 6, the deposition of the organic layer 20 may be performed with placing the substrate 10 above a plurality of deposition cells 50.

Each deposition cell 50 includes an opening 52, a cylindrical housing 51 storing a deposition material 60 therein, and a wall portion 54 extending upward from a portion of the upper surface having the opening 52 of the housing 51. The wall portion 54 of each deposition cell 50 is provided at a part nearest to the central part of the substrate 10. The wall portions 54 can define the incident angles θ of the deposition beams at least at the central part of the substrate 10. With respect to the outer circumferential part of the substrate 10, the distance between the substrate and the deposition cells and the positions of the deposition cells in the horizontal direction are set to achieve the incident angles θ smaller than $90°-\alpha_{max}$ so that deposition beams with incident angles greater than $90°-\alpha_{max}$ do not enter the substrate surface (including the pixel electrodes).

Figure 7:
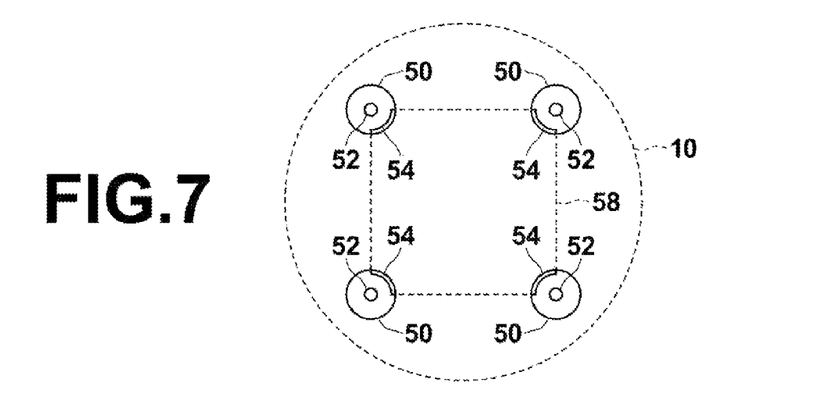
FIG. 7 is a plan view illustrating a layout of deposition cells.
Figure 8:
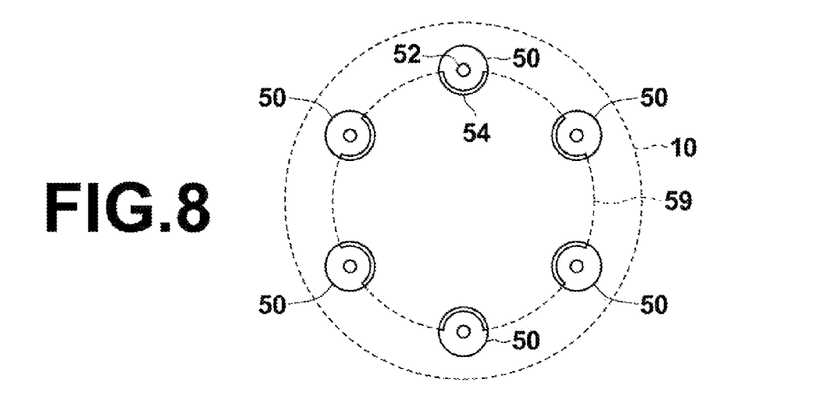
FIG. 8 is a plan view illustrating another layout of the deposition cells.

A method, as shown in FIG. 7, where the deposition cells 50 are positioned at four corners of a square 58 that is smaller than the disk-shaped substrate 10, or a method, as shown in FIG. 8, where the deposition cells 50 are positioned along a concentric circle 59 that is smaller than the disk-shaped substrate 10 is preferred. In the case where the deposition cells 50 are positioned at four corners of the square 58, as shown in FIG. 7, the wall portion 54 of each deposition cell 50 is provided to extend upward from and across at least the part inside the square 58. Further, in the case where the deposition cells 50 are positioned along the concentric circle 59, as shown in FIG. 8, the wall portion 54 of each deposition cell 50 is provided to extend upward from and across at least the part inside the concentric circle 59.

EXAMPLES

Examples of the invention and comparative examples are described.

Examples and comparative examples were produced based on the conditions described below. The examples and the comparative examples had the structure shown in FIG. 1, and were produced under different conditions of the inclination angle of the end portions of the pixel electrodes and the deposition beams for forming the organic layer. The following method was used to produce the examples and the comparative example.

Formation of Pixel Electrodes

On the substrate 10 including a circuit fabricated according to a standard CMOS image sensor process, the pixel electrodes 16 having end portions inclined at the inclination angles α were formed. The pixel size was 3 μm.

Tungsten (W) was used as the material forming the pixel electrodes 16. A tungsten film was formed by sputtering on the substrate surface 10a of the substrate 10. Thereafter, a resist mask was formed by lithography to selectively etch the tungsten film. The etching was performed using a dry etching apparatus (Model E645-ICP, available from Matsushita Electric Industrial Co., Ltd.) that uses inductively-coupled plasma (ICP).

Common process conditions were as follows:
discharge power: 3.2 W/cm² (13.56 MHz), and
pressure: 1.0 Pa (etching gas: $CF_4+Cl_2$).

The individual conditions were as shown in Table 1. Table 1 shows different maximum inclination angles $\alpha_{max}$ (°) and conditions for achieving each inclination angle.

TABLE 1

| Pixel electrode forming conditions | $CF_4$ flow rate (SCCM) | $Cl_2$ flow rate (SCCM) | Biasing power applied to substrate (mW/cm²) | Maximum inclination angle of end portions (°) |
|---|---|---|---|---|
| I | 50 | 10 | 128 | 90 |
| II | 40 | 20 | 128 | 85 |
| III | 30 | 30 | 128 | 70 |
| IV | 20 | 40 | 128 | 60 |
| V | 30 | 30 | 192 | 45 |
| VI | 30 | 30 | 250 | 30 |
| VII | 20 | 40 | 400 | 15 |

Formation of Organic Layer

Thereafter, in a deposition chamber with a reduced pressure of $1\times10^{-4}$ Pa or less, the electron blocking layer having a thickness of 100 nm was deposited on the pixel electrodes at a deposition rate of 10 to 12 nm/s using a resistance heating vapor deposition method with rotating the holder holding the substrate. Then, the photoelectric conversion layer was formed by performing co-evaporation of the material (fullerene 60) of Chemical Formula 1 shown below and the material of Chemical Formula 2 shown below at a deposition rate of 16 to 18 nm/s and a deposition rate of 25 to 28 nm/s, respectively, so that the volume ratio of the material of Chemical Formula 1 to the material of Chemical Formula 2 became 1:3. The thickness was 400 nm.

(Chemical Formula 1)

(Chemical Formula 2)

The deposition cell 40 having the shape shown in FIGS. 4 and 5 for forming the organic layer was used, and conditions of the incident beams for forming the organic layer were as follows.

Common process conditions were as follows:
distance D between the substrate (substrate surface 10a) and the
cell (upper surface of the cell): 240 nm, and
substrate size: 200 nm in diameter.

The individual conditions were as shown in Table 2. Table 2 shows different maximum incident angles θ of the deposition beams and conditions for achieving each maximum incident angle. The distance D between the substrate and the cell, the diameter $d_1$ of the first opening 42, the diameter $d_2$ of the second opening 44, the distance L between the opening 42 and the opening 44, and the maximum exiting angle (incident angle) θ of the deposition beams are schematically shown in FIG. 4.

TABLE 2

| Vapor deposition condition | Diameter ($d_1$) of first opening | Diameter ($d_2$) of second opening | Distance (L) between first opening and second opening | Maximum incident angle (θ) of deposition beams |
|---|---|---|---|---|
| A | 2 mm | 6 mm | 25 mm | 4° |
| B | 2 mm | 14 mm | 25 mm | 13° |
| C | 2 mm | 22 mm | 25 mm | 21° |
| D | 2 mm | 30 mm | 25 mm | 29° |
| E | 2 mm | 38 mm | 25 mm | 35° |
| F | 2 mm | 46 mm | 25 mm | 41° |
| G | 2 mm | 54 mm | 25 mm | 46° |
| H | 2 mm | 62 mm | 25 mm | 50° |
| I | 2 mm | 70 mm | 25 mm | 54° |
| J | 2 mm | 94 mm | 25 mm | 61° |

Thereafter, the substrate was conveyed to a sputtering chamber, where an ITO film forming a counter electrode having a thickness of 10 nm was formed on the photoelectric conversion layer by RF magnetron sputtering.

Devices of Examples 1 to 5 and Comparative Examples 1 to 5 were produced under various combinations of the pixel electrode forming conditions shown in Table 1 and the organic layer deposition conditions shown in Table 2. Table 3 shows the maximum inclination angle $\alpha_{max}$ of the pixel electrodes, the incident angle θ of the deposition beams, and results of evaluations about the presence or absence of cracking and voids (grooves, cavities) in the organic layer of each of Examples 1 to 5 and Comparative Examples 1 to 5.

Example 1

In Example 1, the pixel electrodes were formed under the pixel electrode forming condition II where the maximum inclination angle ($\alpha_{max}$) of the end portions of the pixel electrodes was 85°, and the organic layer was deposited under the vapor deposition condition A where the angle (θ) of the deposition beams was 4°.

Example 2

In Example 2, the pixel electrodes were formed under the pixel electrode forming condition III where the maximum inclination angle of the end portions of the pixel electrodes was 70°, and the organic layer was deposited under the vapor deposition condition B where the angle of the deposition beams was 13°.

Example 3

In Example 3, the pixel electrodes were formed under the pixel electrode forming condition IV where the maximum inclination angle of the end portions of the pixel electrodes was 60°, and the organic layer was deposited under the vapor deposition condition D where the angle of the deposition beams was 29°.

Example 4

In Example 4, the pixel electrodes were formed under the pixel electrode forming condition V where the maximum inclination angle of the end portions of the pixel electrodes was 45°, and the organic layer was deposited under the vapor deposition condition F where the angle of the deposition beams was 41°.

Example 5

In Example 5, the pixel electrodes were formed under the pixel electrode forming condition VI where the maximum inclination angle of the end portions of the pixel electrodes was 30°, and the organic layer was deposited under the vapor deposition condition G where the angle of the deposition beams was 46°.

Comparative Example 1

In Comparative Example 1, the pixel electrodes were formed under the pixel electrode forming condition I where the maximum inclination angle of the end portions of the pixel electrodes was 90°, and the organic layer was deposited under the vapor deposition condition A where the angle of the deposition beams was 4°.

Comparative Example 2

In Comparative Example 2, the pixel electrodes were formed under the pixel electrode forming condition II where the maximum inclination angle of the end portions of the pixel electrodes was 85°, and the organic layer was deposited under the vapor deposition condition C where the angle of the deposition beams was 21°.

Comparative Example 3

In Comparative Example 3, the pixel electrodes were formed under the pixel electrode forming condition III where the maximum inclination angle of the end portions of the pixel electrodes was 70°, and the organic layer was deposited under the vapor deposition condition E where the angle of the deposition beams was 35°.

Comparative Example 4

In Comparative Example 4, the pixel electrodes were formed under the pixel electrode forming condition V where the maximum inclination angle of the end portions of the pixel electrodes was 45°, and the organic layer was deposited under the vapor deposition condition G where the angle of the deposition beams was 46°.

Comparative Example 5

In Comparative Example 5, the pixel electrodes were formed under the pixel electrode forming condition VI where the maximum inclination angle of the end portions of the pixel electrodes was 30°, and the organic layer was deposited under the vapor deposition condition J where the angle of the deposition beams was 61°.

All the Examples 1 to 5 satisfied the conditions of $30°\leq\alpha\leq85°$ and $\theta<90°-\alpha_{max}$. On the other hand, Comparative Examples 1 to 5 did not satisfy the conditions of $30°\leq\alpha\leq85°$ and $\theta<90°-\alpha_{max}$.

Table 3 shows the maximum inclination angle $\alpha_{max}$, the maximum incident angle θ of the deposition beams, and the presence or absence of cracking and of voids of each of the examples and the comparative examples.

TABLE 3

| | Maximum inclination angle $\alpha_{max}$ of end portions of pixel electrodes | Maximum incident angle $\theta$ of deposition beams | Cracking | Voids |
|---|---|---|---|---|
| Example 1 | 85° | 4° | none | none |
| Example 2 | 70° | 13° | none | none |
| Example 3 | 60° | 29° | none | none |
| Example 4 | 45° | 41° | none | none |
| Example 5 | 30° | 46° | none | none |
| Comparative Example 1 | 90° | 4° | present | present |
| Comparative Example 2 | 85° | 21° | present | present |
| Comparative Example 3 | 70° | 35° | present | present |
| Comparative Example 4 | 45° | 46° | present | present |
| Comparative Example 5 | 30° | 61° | present | present |

The presence or absence of cracking and that of voids were checked by preparing samples for cross-sectional TEM observation from the individual devices and taking and observing a cross-sectional TEM photograph of each sample.

As can be seen from Table 3, Examples 1 to 5, which satisfied the conditions of the invention, had no cracking and no voids. On the other hand, Comparative Examples 1 to 5, which did not satisfy the conditions of the invention, had cracking and voids. It is clear from these results that formation of cracking and voids in the organic layer can be suppressed when the conditions of the invention are satisfied. By suppressing the formation of cracking and voids, point defects in a displayed image can be suppressed.

What is claimed is:

1. An organic image sensor having a plurality of pixel portions on a substrate, the organic image sensor comprising:
    a plurality of pixel electrodes arranged apart from one another on the substrate and corresponding in number to the number of the pixel portions;
    an organic layer disposed in the form of a continuous film on and between the pixel electrodes, the organic layer including a photoelectric conversion layer shared by the plurality of pixel portions; and
    a counter electrode disposed on the organic layer and shared by the plurality of pixel portions,
    wherein the pixel electrodes have end portions inclined at inclination angles $\alpha$, where $30° \leq \alpha \leq 85°$, relative to a substrate surface of the substrate, and
    the organic layer is a film formed by vapor deposition using deposition beams that enter the substrate surface at incident angles smaller than $90° - \alpha_{max}$, where $\alpha_{max}$ is a maximum inclination angle among the inclination angles of the end portions of the pixel electrodes, under a deposition substrate temperature condition lower than a glass transition temperature of the organic layer.

2. A method of producing an organic image sensor having a plurality of pixel portions on a substrate, the organic image sensor including a plurality of pixel electrodes arranged apart from one another on the substrate, an organic layer disposed in the form of a continuous film on and between the pixel electrodes, the organic layer including a photoelectric conversion layer shared by the plurality of pixel portions, and a counter electrode disposed on the organic layer and shared by the plurality of pixel portions, the method comprising the steps of:
    forming, as the electrodes on the substrate, a plurality of pixel electrodes having end portions inclined at inclination angles $\alpha$, where $30° \leq \alpha \leq 85°$, relative to a substrate surface of the substrate; and
    forming an organic layer including a photoelectric conversion layer that generates electric charges depending on received light above the pixel electrodes by vapor deposition using deposition beams that enter the substrate surface at incident angles smaller than $90° - \alpha_{max}$, where $\alpha_{max}$ is a maximum inclination angle among the inclination angles of the end portions of the pixel electrodes, under a deposition substrate temperature condition lower than a glass transition temperature of the organic layer.

* * * * *